United States Patent [19]

Kodama et al.

[11] Patent Number: 5,760,592
[45] Date of Patent: Jun. 2, 1998

[54] METHOD AND DEVICE FOR INSPECTING CONNECTORS

[75] Inventors: Shinji Kodama; Noboru Yamaguchi, both of Shizuoka, Japan

[73] Assignee: Yazaki Corporation, Tokyo, Japan

[21] Appl. No.: 688,765

[22] Filed: Jul. 31, 1996

[30] Foreign Application Priority Data

Aug. 2, 1995 [JP] Japan ................................. 7-197689

[51] Int. Cl.$^6$ ................................................ G01R 31/04
[52] U.S. Cl. ........................ 324/538; 324/556; 439/489; 439/490
[58] Field of Search ........................ 324/538, 555, 324/556; 439/488, 489, 490, 912

[56] References Cited

U.S. PATENT DOCUMENTS

| 4,849,743 | 7/1989 | Ohno | 439/490 X |
| 5,670,884 | 9/1997 | Kodama | 324/538 |
| 5,694,043 | 12/1997 | Kodama | 324/538 |

FOREIGN PATENT DOCUMENTS 62-47093  12/1987  Japan .
6-20314   5/1994   Japan .

Primary Examiner—Glenn W. Brown
Attorney, Agent, or Firm—Armstrong, Westerman, Hattori, McLeland & Naughton

[57] ABSTRACT

A connector housing (22) before insertion of a terminal lug thereinto is set in an inspection chamber (7) on a connector inspection device (A), so that a movable pin (9) of an inspection pin (8) is located inside a front end portion of the terminal-accommodating chamber in the connector housing. With the terminal lug thereafter inserted into the accommodating chamber, the movable pin is moved back against a spring (11) so that, when the terminal lug has been fully inserted, the movable pin comes into contact with a stationary pin to energize an inspection electric circuit (18). Thus, the full insertion of the terminal lug (C) can be known. Hold on the terminal lug is then released to allow the terminal lug to retract by a distance corresponding to a clearance (D) present between an edge of a locking portion (28) of the terminal lug and a locking projection (24a) of a resilient locking piece (24), so that the movable pin is now separated from the stationary pin to shut off the inspection electric circuit. Owing to the above, concurrently with the insertion and locking of terminal lugs in terminal-accommodating chambers in a connector housing, the terminal lugs can be individually inspected for their insertion condition.

4 Claims, 13 Drawing Sheets

METHOD AND DEVICE FOR INSPECTING CONNECTORS

BACKGROUND OF THE INVENTION

1. Field of the Invention

This invention relates to a method and a device for inspecting an electric connector used in connection of automotive wiring harnesses and the like, with which concurrently with the insertion and locking of terminal lugs in terminal-accommodating chambers to assemble a connector, it can be inspected whether the terminal lugs have been inserted satisfactory or not.

2. Description of the Related Art

Figure 14A:
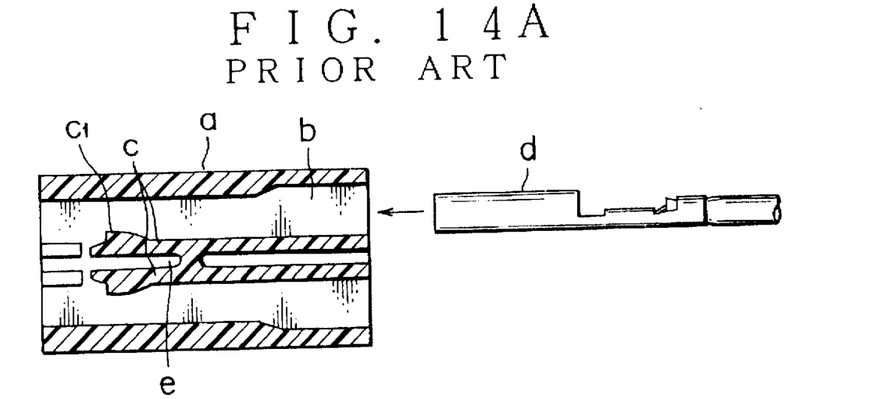
FIGS. 14A to 14C are explanatory views of locking steps of a terminal lug in a conventional connector housing.

Referring to FIG. 14, a connector housing a has a plurality of terminal-accommodating chambers b formed therein, each containing a resilient cantilever locking piece c for locking in place a terminal lug d which has been inserted into the terminal-accommodating chamber from the rear.

Figure 14B:
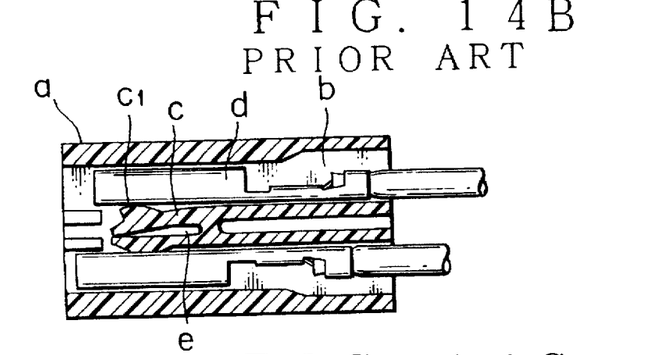
Figure 14C:
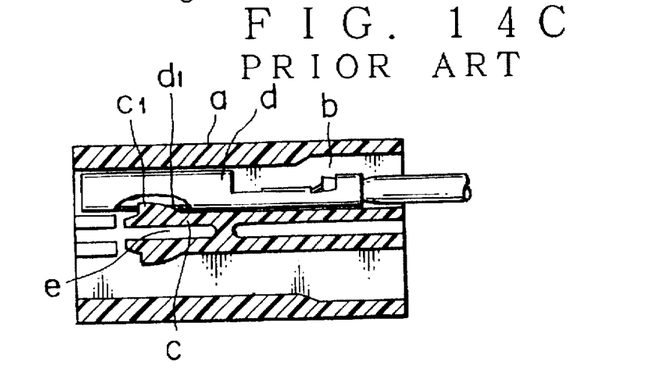

During the insertion of the terminal lug d, its front end portion contacts locking projection c1 of locking piece c, thereby to resiliently displace locking piece c into the resilient-displacement allowing space e (FIG. 14B). When locking hole d1 comes into alignment with locking piece c1, the latter restores its original position and locks the terminal lug d in place (FIG. 14C).

Figure 15:
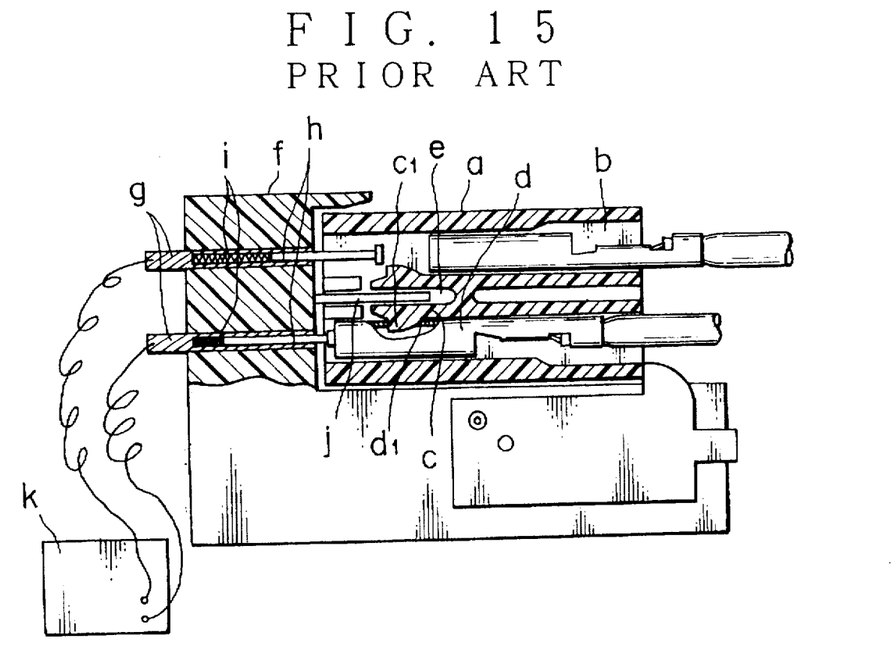
FIG. 15 is a partially sectional view showing the connector inspection method according to the conventional connector inspection device.

Referring to FIG. 15, designated at f is an inspection device which has tubular inspection terminals g mounted therein in correspondence to terminal-accommodating chambers b formed in housing a, each of the inspection terminals having a slidable continuity-test pin h normally urged by a coil spring i to project forwardly. Inspection device f is further provided with an incomplete-insertion detector arm j for detecting when a terminal lug d is in incompletely-inserted position in housing a.

If a to-be-inspected connector a is set on inspection device f (FIG. 15), incomplete-insertion detector arm j enters resilient-displacement allowing space e, while a terminal lug d locked in fully-inserted position as in the lower chamber in FIG. 15 abuts against the continuity-test pin h to push same back, with the result that a continuity checker k indicates a good test result. The terminal lug d in the upper chamber in FIG. 15, which is not locked by locking piece c, does not abut against the continuity-test pin h, resulting in the checker k indicating not good.

Figure 16:
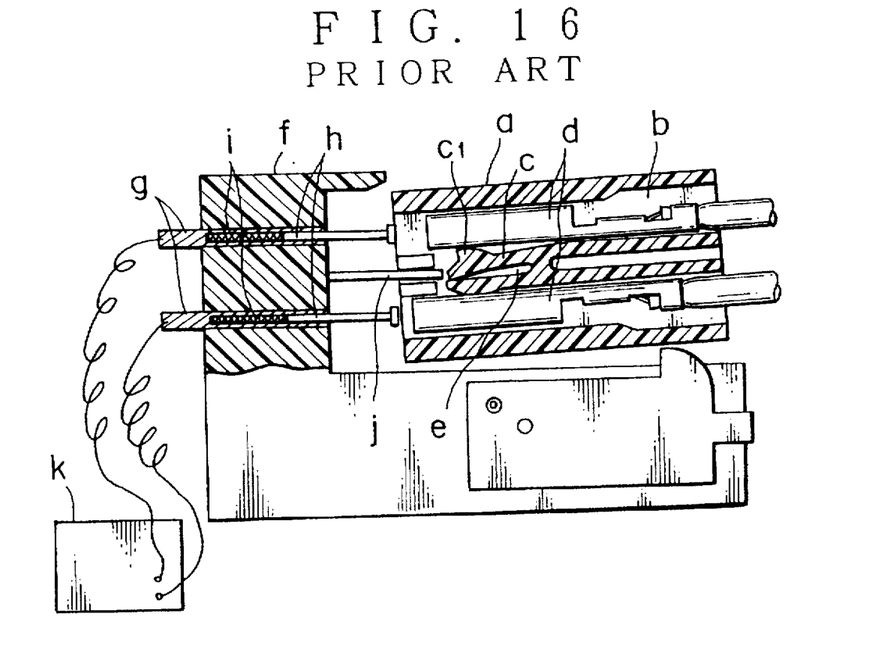
FIG. 16 is a partially sectional view showing a drawback of the connector inspection method according to the inspection device of FIG. 15.

Referring to FIG. 16, the terminal lug d in the upper terminal-accommodating chamber, which is in incompletely-inserted position, displaces locking piece c into resilient-displacement allowing space e, making it impossible for the incomplete-insertion detector arm j to enter the space e and for the to-be-inspected connector a to be set on the inspection device f. Thus, it can be detected that the terminal lug d is in incompletely-inserted position.

The prior art as mentioned above, however, is disadvantageous in that, if a terminal lug d is in the incompletely-inserted postion where locking piece c is displaced, it becomes impossible for the incomplete-insertion detector arm j to enter the resilient-displacement allowing space e, with the result that terminal lugs d of all electrodes cannot be subjected to inspection, i.e., terminal lugs d cannot be individually subjected to inspection.

Figure 17:
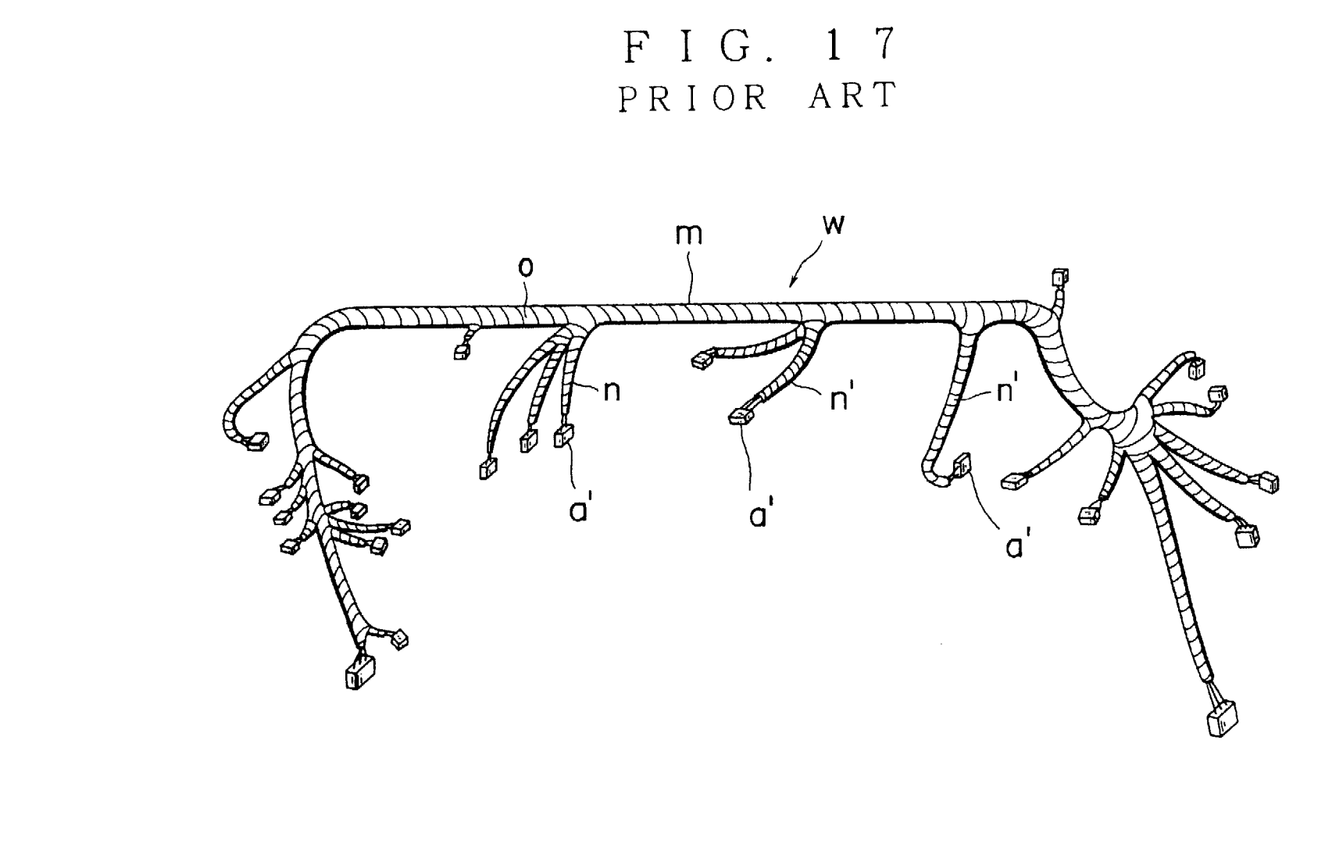
FIG. 17 is a perspective view of a wiring harness in general use.

Further, in the above case, the inspection for the inserted state of terminal lugs is effected after completion of the assembly of the connector. Therefore, as shown in FIG. 17, if a terminal lug(s) has been found defective after completion of a wiring harness w— which comprises a main line m, a plurality of branch lines n, n' ... each with a connector a' at its end, and a tape o wrapped around the main and branch lines for their protection— the wiring harness is as a whole condemned as defective. This results in the replacement of the entire connector a' containing the defective terminal lug(s) and its branch line n, which requires much time and labor to be consumed.

SUMMARY OF THE INVENTION

This invention has been accomplished to overcome the above drawbacks and an object of this invention is to provide a method and a device for inspecting connectors, according to which concurrently with the insertion of terminal lugs into terminal-accommodating chambers in a connector housing and their locking therein to assemble the connector, the terminal lugs are individually reliably inspected for complete insertion without errors.

In order to attain the object, according to an aspect of this invention, there is provided a method of inspecting a connector by an inspection device, the connector including a connector housing, a terminal-accommodating chamber in the connector housing, and a resilient locking piece with a locking projection provided in the terminal-accommodating chamber with a resilient-displacement allowing space adjacent thereto, the inspection device including an inspection chamber, an inspection pin provided in the inspection chamber and comprising a stationary pin and a movable pin normally urged apart from the stationary pin by means of a spring, and an inspection electric circuit which is energized when the stationary and movable pins are brought into contact with each other, which comprises the steps of: setting the connector housing in the inspection chamber so that the movable pin is located inside a front end portion of the terminal-accommodating chamber; inserting a terminal lug into the terminal-accommodating chamber from a side remote from the inspection pin, the terminal lug including a locking portion and being attached to an end of an electric wire; advancing the terminal lug while through contact therewith displacing the resilient locking piece into the resilient-displacement allowing space so that the resilient locking piece, when in alignment with the locking portion of the terminal lug, restores its original position to have the locking projection engaged in the locking portion to lock the terminal lug in the terminal-accommodating chamber, and through contact therewith moving the movable pin rearwardly against the spring towards the stationary pin so that in fully-inserted position the movable pin comes into contact with the stationary pin to energize the inspection electric circuit and thereby to let it be known that the terminal lug has been fully inserted; and releasing hold from the terminal lug so that the movable pin is moved by the spring towards the terminal lug by a distance corresponding to a clearance present between an edge of the locking portion of the terminal lug and the locking projection, thereby to separate the movable pin from the stationary pin and cut off the inspection electric circuit (claim 1).

According to another aspect of this invention, there is provided a method of inspecting a connector by an inspection device, the connector including a connector housing, a terminal-accommodating chamber in the connector housing, and a resilient locking piece with a locking projection provided in the terminal-accommodating chamber with a resilient-displacement allowing space adjacent thereto, the inspection device including an inspection chamber, a pair of spring switches provided in the inspection chamber, and an inspection electric circuit which is energized when the spring switches are closed, which comprises the steps of:

setting the connector housing in the inspection chamber so that the pair of spring switches is located inside the resilient-displacement allowing space in the terminal-accommodating chamber; inserting a terminal lug into the terminal-accommodating chamber from a side remote from the pair of spring switches, the terminal lug including a locking portion and being attached to an end of an electric wire; advancing the terminal lug while through contact therewith displacing the resilient locking piece into the resilient-displacement allowing space so that the spring switches are brought into contact with each other to energize the inspection electric circuit and thereby to let it be known that the terminal lug is on its way to be fully inserted; and further advancing the terminal lug so that the resilient locking piece, when in alignment with the locking portion of the terminal lug, restores its original position to have the locking projection engaged in the locking portion to lock the terminal lug in the terminal-accommodating chamber, and at the same time to open the spring switches to cut off the inspection electric circuit in fully-inserted position (claim 2).

According to a yet another aspect of this invention, there is provided a device for inspecting a connector including a connector housing, a plurality of terminal-accommodating chambers formed in the connector housing, and a resilient locking piece provided in each of the terminal-accommodating chambers and including a locking projection engageable with a terminal lug for locking the terminal lug in the terminal-accommodating chamber, comprising: an inspection chamber for setting therein the connector; and a plurality of inspection pins provided in the inspection chamber, each of the inspection pins comprising a stationary pin and a movable pin normally urged apart from the stationary pin to project forwardly into a related one of the terminal-accommodating chambers when the connector housing is set in the inspection chamber, the stationary pin being connected to one end of an inspection electric circuit and the movable pin to the other end of the electric circuit, wherein when, after the connector housing has been set in the inspection chamber, a terminal lug, which is attached to an end of an electric wire, is fully inserted into one of the terminal-accommodating chambers, the terminal lug abuts against the movable pin to move same rearwardly against the spring into contact with the stationary pin to energize the inspection electric circuit, and wherein, after the electric circuit has been energized, hold is released from the terminal lug so that the movable pin is separated by the spring from the stationary pin to retract the terminal lug until it abuts against the locking projection and to shut off the inspection electric circuit (claim 3).

According to a further aspect of this invention, there is provided a device for inspecting a connector including a connector housing, a plurality of terminal-accommodating chambers formed in the connector housing, and a resilient locking piece provided in each of the terminal-accommodating chambers with a resilient-displacement allowing space adjacent thereto and including a locking projection engageable with a terminal lug for locking the terminal lug in the terminal-accommodating chamber, comprising: an inspection chamber for setting therein the connector; and a plurality of pairs of spring switches provided in the inspection chamber, each of the pairs of spring switches being connected to an inspection electric circuit and being of such size as to advance into a related one of the resilient-displacement allowing spaces in the terminal-accommodating chambers when the connector housing is set in the inspection chamber, wherein when, after the connector housing has been set in the inspection chamber, a terminal lug, which is attached to an end of an electric wire, is inserted into one of the terminal-accommodating chambers and on its way to be fully inserted, the terminal lug contacts the resilient locking piece to displace same into the resilient-displacement allowing space, thereby to close the related one of the pairs of spring switches to energize the inspection electric circuit, and wherein when the terminal lug has advanced into fully-inserted position, the resilient locking piece restores its original position to allow the pair of spring switches to open and shut off the electric circuit (claim 4).

In the inventions as recited in claims 1 and 3, if the terminal lug is fully inserted into the terminal-accommodating chamber, it is locked therein while at the same time causing the inspection electric circuit to be energized, for example, to light a lamp. If the inserting operation is stopped and the terminal lug is released, the circuit is shut off to put out the lamp, thereby letting it be known that the terminal lug has been fully inserted and locked in position. In case of incomplete insertion, the lamp is not lighted, and thus an abnormality (incomplete insertion) can be detected.

Likewise, if a terminal lug, which has once been fully inserted to put on the light, is not locked in position due to a damage present in the resilient locking piece or in the locking portion of the terminal lug, the terminal lug is pushed by the spring via the movable pin to slip off rearwardly, thereby letting it be known there exists an abnormality. Incidentally, inspection for a defect in the continuity between a terminal lug and its electric wire may be performed with another electric circuit including the inspection pin.

In the inventions as recited in claims 2 and 4, when the terminal lug is on its way to be fully inserted in the terminal-accommodating chamber, the pair of spring switches are caused to be closed, thereby to energize the inspection electric circuit and, for example, to light a lamp. If the terminal lug is further inserted and put into fully-inserted postion, the resilient locking piece returns to its original position so as to shut off the circuit and to put out the lamp. Thus, the full insertion and locking of the terminal lug can be known. In case of incomplete insertion, the lamp remains lighted, and an abnormality can be detected.

The above and other objects, features and advantages of this invention will become apparent from the following description and the appended claims, taken in conjunction with the accompanying drawings in which like parts or elements are denoted by like reference characters.

DESCRIPTION OF THE PREFERRED EMBODIMENT

Embodiments of this invention will now be described with reference to the attached drawings.

Referring to FIGS. 1 to 5, a connector inspection device A comprises a box-like base mount 1, a mount opening 3 formed on one side on a top plate 2 thereof, and an inspection main body 4 removably mounted in the mount opening 3. A check lamp 19 of a later-described electric circuit 18 for inspection is provided on the other side on the top plate 2.

Inspection main body 4 comprises an insulating housing 5 of synthetic resin and a hood 6 integrally provided at one end of the housing. Hood 6 has an inspection chamber 7 formed therein for a connector B to be inspected, and housing 5 has a plurality of inspections pins 8 provided therein in correspondence to a plurality of terminal-accommodating chambers 23 in the housing 22 of connector B. Each inspection pin 8 includes a stationary pin 10 and a movable pin 9 movable coaxially relative to the stationary pin, the movable pin being normally urged by a coil spring 11 to forwardly project into the inspection chamber 7.

Figure 4:
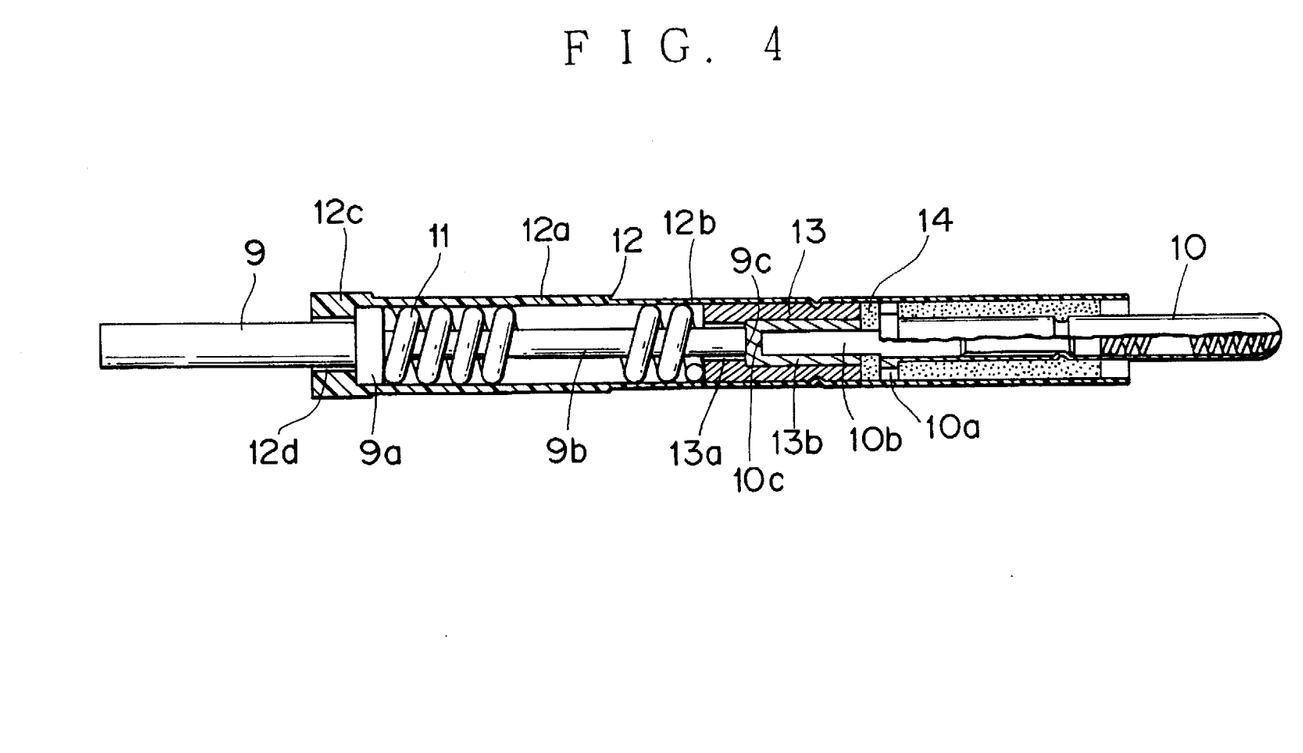
FIG. 4 is an enlarged detailed longitudinal sectional view of an inspection pin of FIG. 3.
Figure 5:
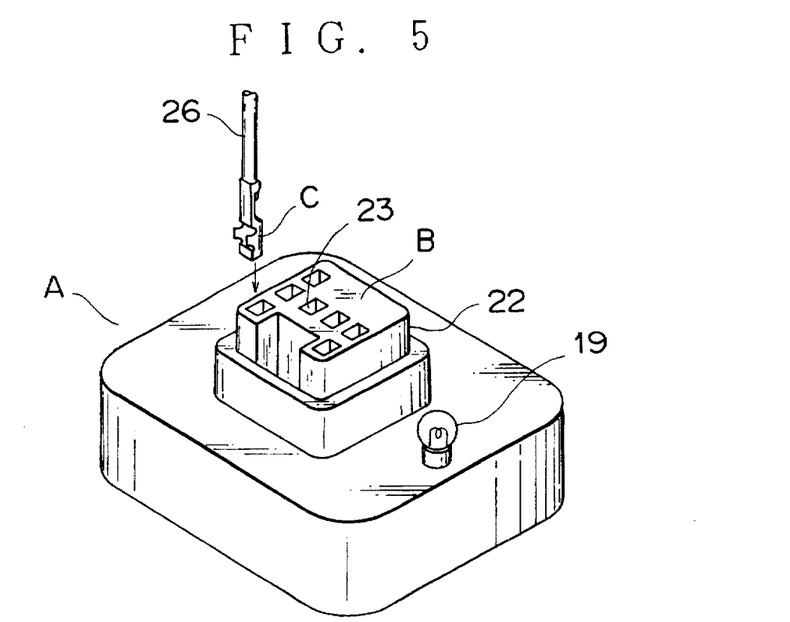
FIG. 5 is a perspective view of the connector inspection device of FIG. 1, with a to-be-inspected connector set thereon.

Inspection pin 8, as shown in the enlarged cross section in FIG. 4, has a tubular body 12 for receipt and retention therein of movable and stationary pins 9 and 10 and coil spring 11. Tubular body 12 is of electrically conductive metal and comprises a front thick portion 12a, a rear thin portion 12b and a stop ring 12c continuously provided at the front end of the thick portion 12a.

Inside tubular body 12, a collar 13 is rigidly fixed at an intermediate length of the rear thin portion 12b through crimping or the like, the collar, like tubular body 12, being formed of electrically conductive metal. Movable pin 9 is slidably mounted between stop ring 12c and collar 13. In other words, movable pin 9 is at the rear end provided with a smaller-diameter portion 9b longitudinally extending therefrom via a flange portion 9a. Flange portion 9a is slidably fitted inside thick portion 12a, with movable pin 9 projecting through a hole 12d in stop ring 12c into inspection chamber 7. Movable pin 9 is normally forwardly urged by coil spring 11 around smaller-diameter portion 9b, so that when flange portion 9a is in contact with an inner surface of stop ring 12c, smaller-diameter portion 9b is at the rear end supported in a hole 13a provided through the front end of collar 13.

Stationary pin 10 is at the front end provided with a smaller-diameter portion 10b longitudinally extending therefrom via a flange portion 10a. This smaller-diameter portion 10b has a front half thereof positioned inside a hole 13b at a rear half of collar 13, so that its front end surface 10c faces the rear end surface 9c of smaller-diameter portion 9b with a predetermined space therebetween. A spacer 14 of an insulating material such as synthetic resin, ceramics or the like is provided at the base of smaller-diameter portion 10b and around stationary pin 10 including flange portion 10a to fix them in place and insulate them from tubular body 12. Stationary pin 10 is extended rearwardly out of tubular body 12.

Each inspection pin 8 has a front half thereof rigidly mounted in a relevant pin-receiving chamber 15 inside the housing 5 in such manner that movable pin 9 retractably projects into inspection chamber 7 through a smaller-diameter hole 15a at the front end of the pin-receiving chamber 15. The tubular bodies 12 of inspection pins 8 which are rearwardly projecting from housing 5 are connected to one another by a short-circuit plate 16. Housing 5 is on its outer periphery provided with a resilient lock arm 17 having locking projections 17a, the locking projections engaging with not-shown locking portions inside mounting opening 3 to lock the housing in place on base mount 1. A pair of guide pieces 7a, 7a for connector B to be inspected are provided inside inspection chamber 7 in hood 6.

Figure 6:
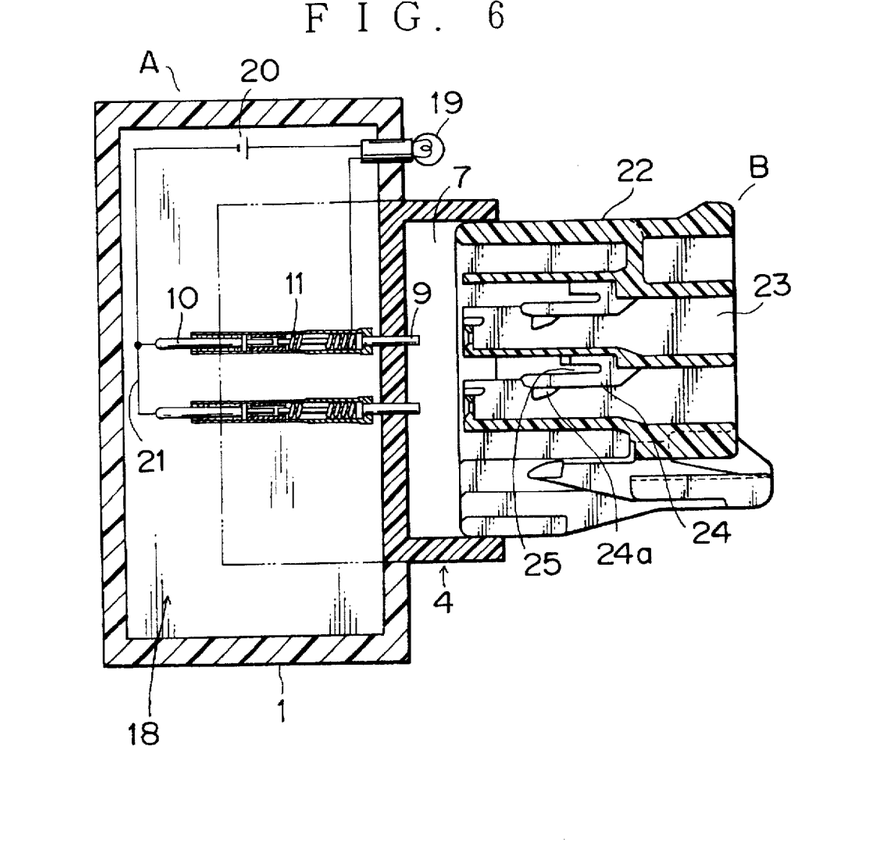
FIGS. 6, 7 and 8 are explanatory views of sequential inspection steps of a connector with the connector inspection device of FIG. 1.

FIG. 6 is a sectional view of connector inspection device A provided with inspection pins 8 as described above, with a portion thereof shown simplified. Check lamp 19, short-circuit plate 16 (see FIG. 3), and stationary pin 10 in each inspection pin 8 are connected in series via a lead wire 21 to a battery 20 to form an inspection electric circuit 18.

The inspection of a connector with inspection device A will now be described with reference to FIGS. 6 to 9.

First, as shown in FIG. 6, connector B with terminal lugs not yet inserted thereinto is set into inspection chamber 7 on connector inspection device A. In other words, housing 22 is pushed until its front end abuts against the innermost wall of inspection chamber 7 as shown in FIG. 7.

Figure 7:
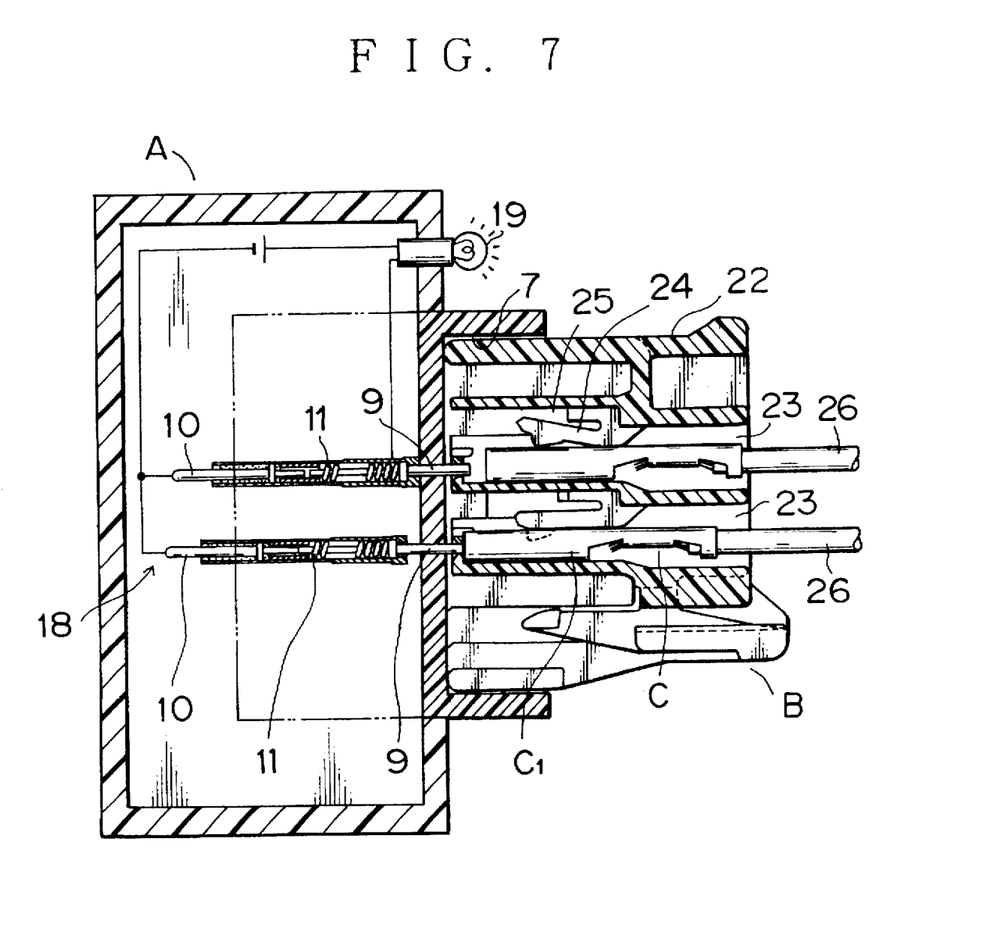

If a terminal lug C attached to the end of an electric wire 26 is then automatically or manually pushed into fully-inserted position as in terminal-accommodating chamber 23 on the lower side in FIG. 7, an electric contact C1 at the front end abuts against movable pin 9 to retract same against coil spring 11 into contact with stationary pin 10, at which time the electric circuit 18 is energized to light check lamp 19.

The terminal lug C is in incompletely-inserted position in terminal-accommodating chamber 23 on the upper side in FIG. 7, with resilient locking piece 24 being bent into resilient-displacement allowing space 25 adjacent thereto. Coil spring 11 maintains movable and stationary pins 9 and 10 apart from each other, resulting in the electric circuit not energized.

Figure 8:
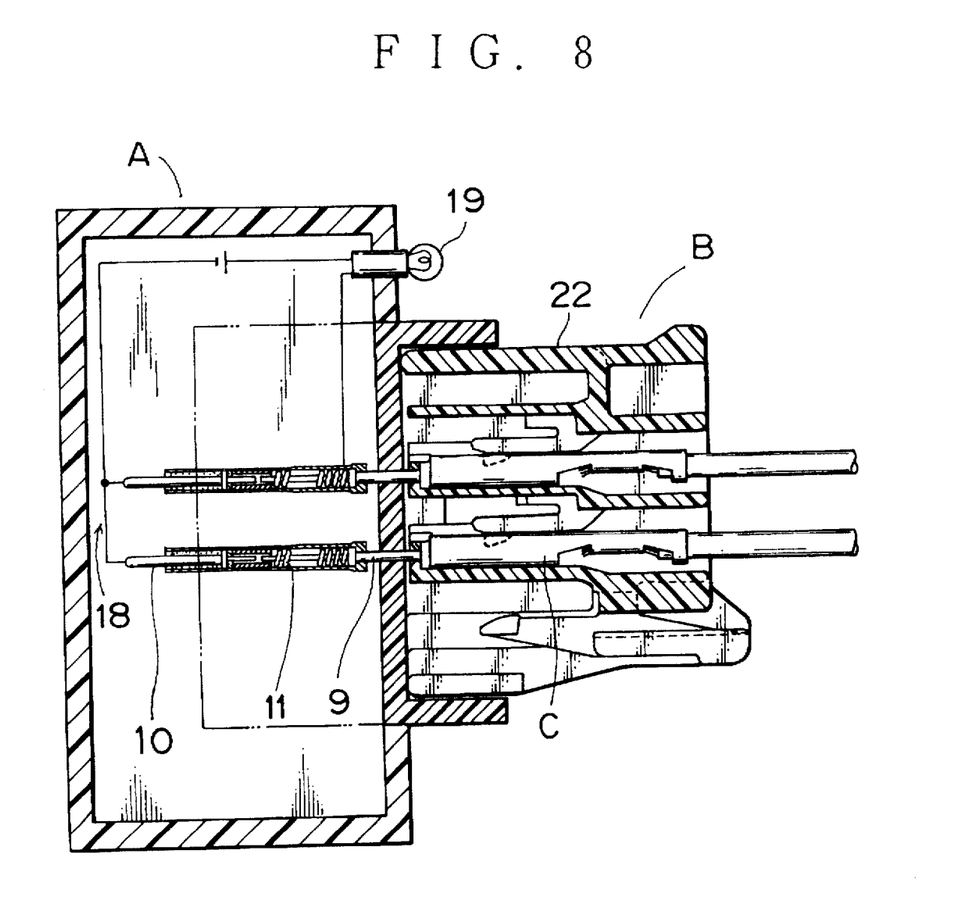
Figure 9A:
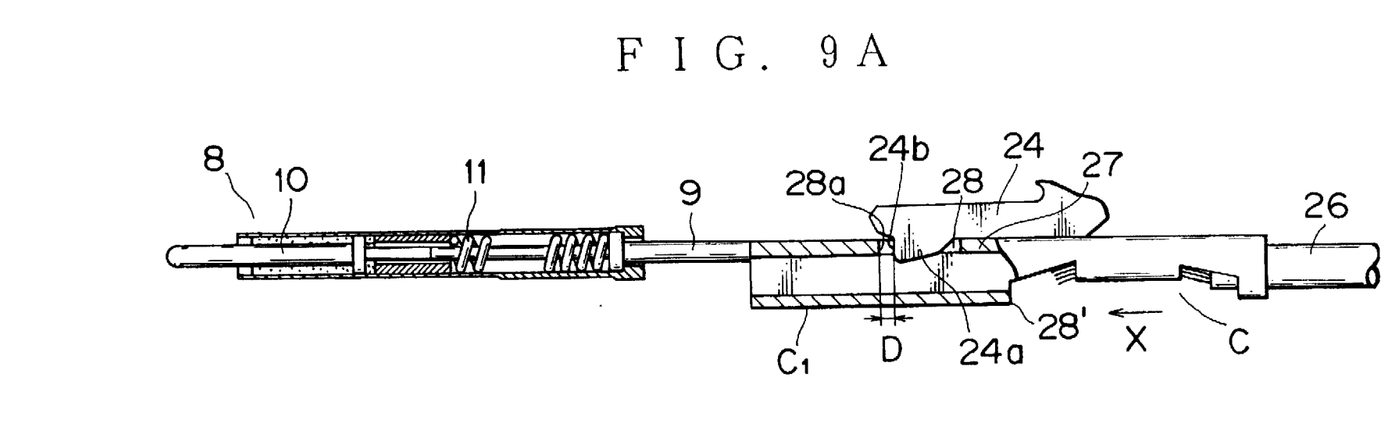
FIGS. 9A and 9B are explanatory views of the operation of the connector inspection device.

Each terminal lug C is in fully-inserted position in FIG. 8. In fully-inserted position, locking projection 24a of resilient locking piece 24 contained in terminal-accommodating chamber 23 is engaged in the locking portion of terminal lug C in the form of locking hole 28 in terminal-lug plate 27 (see FIG. 9). Further, since movable pin 9 is pushed by coil spring 11 to terminal lug C to part from stationary pin 10, inspection electric circuit 18 is cut off to put out check lamp 19.

Figure 9B:
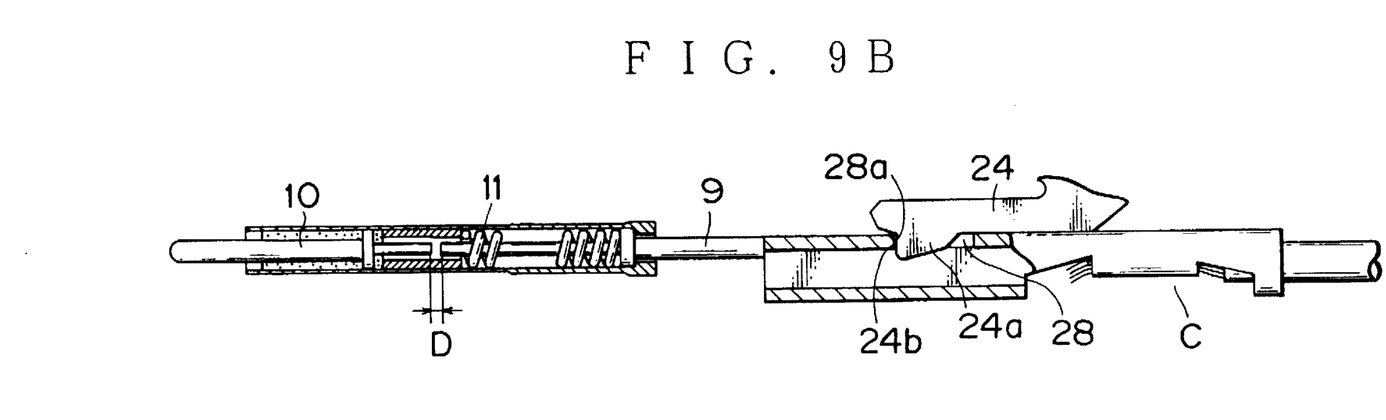

FIGS. 9A and 9B show the interrelations between terminal lug C, resilient locking piece 24 and inspection pin 8.

Terminal lug C is being pushed to the utmost in the direction of an arrow X in terminal-accommodating chamber 23 in FIG. 9A. Terminal lug C at the electric contact portion C1 abuts against movable pin 9 to push the latter into contact with stationary pin 10, so that the electric circuit 18 is energized to light check lamp 19. In this instance, there exists a clearance D between locking projection 24a of resilient locking piece 24 and the front edge of locking hole 28 in the terminal lug C. This clearance D corresponds to a distance by which terminal lug C is inserted beyond and returns to locking projection 24a after the latter has entered locking hole 28 in resilient locking piece 24.

FIG. 9B shows the state where hold or the like with which terminal lug C has been pushed is released after check lamp 19 has lighted, i.e., after insertion of terminal lug C into fully-inserted position. Movable pin 9 is urged by coil spring 11 to move terminal lug C back by the distance corresponding to clearance D. In other words, terminal lug C is moved back until front edge 28a of locking hole 28 abuts against front end surface 24b of the locking projection 24a. This results in movable pin 9 separated from stationary pin 10 by the distance corresponding to clearance D, and the electric circuit 18 is cut off.

While in the above example the locking portion of terminal lug C which engages with locking projection 24a of resilient locking piece 24 has been described as locking hole 28, it is also possible to employ a structure in which a shoulder portion of electric contact portion C1, indicate at 28' in FIG. 9A engages with resilient locking piece 24.

With the construction as described above, during the course of insertion of terminal lug C into terminal-accommodating chamber 23 of housing 22, it can be inspected through the lighting of check lamp 19 that the lug has been fully inserted, and through the putting out of the lamp that the lug has been locked in position. Thus, concurrently with assembly of connector B or a wiring harness, it can be known whether terminal lug C has been locked in fully-inserted position or not.

Referring now to FIGS. 10 to 13, there is shown a connector inspection device A' according to another embodiment of this invention, in which a pair of spring switches 30, 31 is provided in replacement of an inspection pin 8, the spring switches being adapted to advance into a resilient-displacement allowing space 25 in terminal-accommodating chamber 23.

Figure 1:
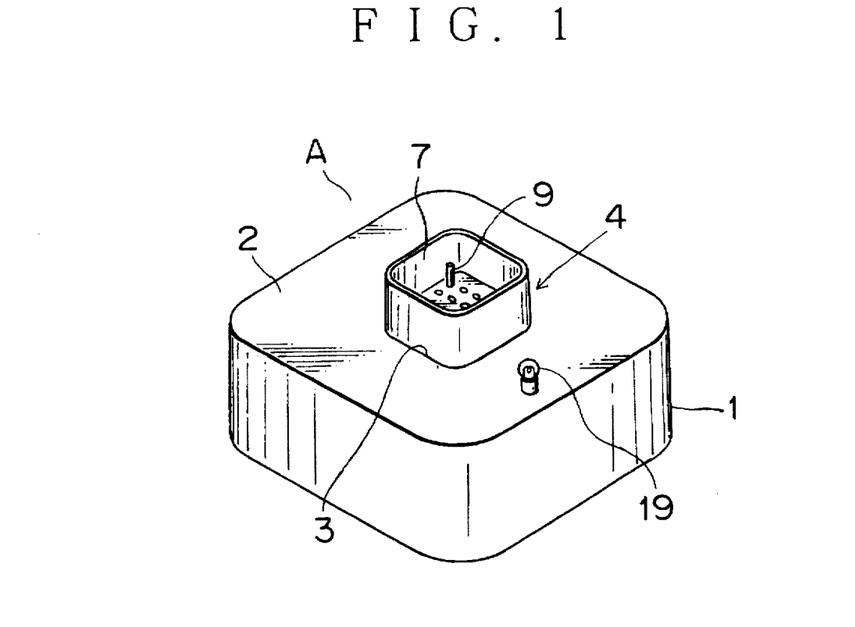
FIG. 1 is a perspective view of a connector inspection device according to this invention.
Figure 2:
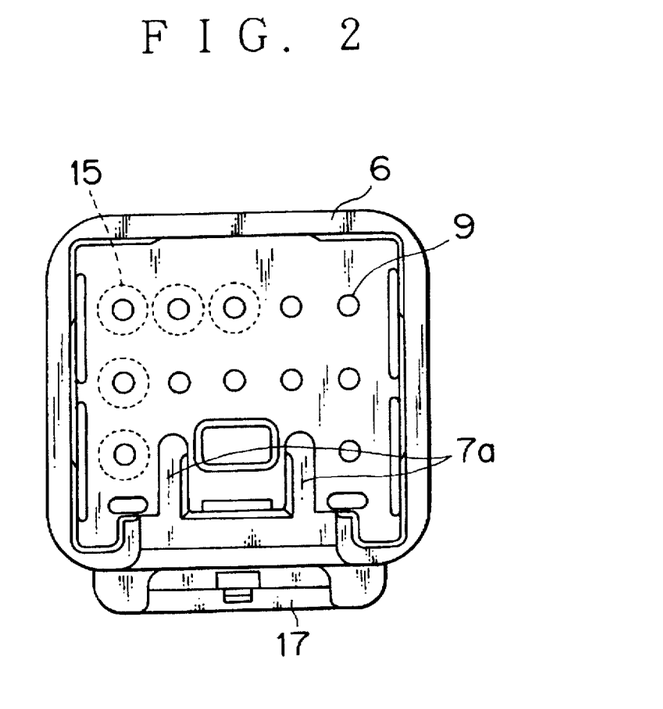
FIG. 2 is a plan view of an inspection main body of the inspection device.
Figure 3:
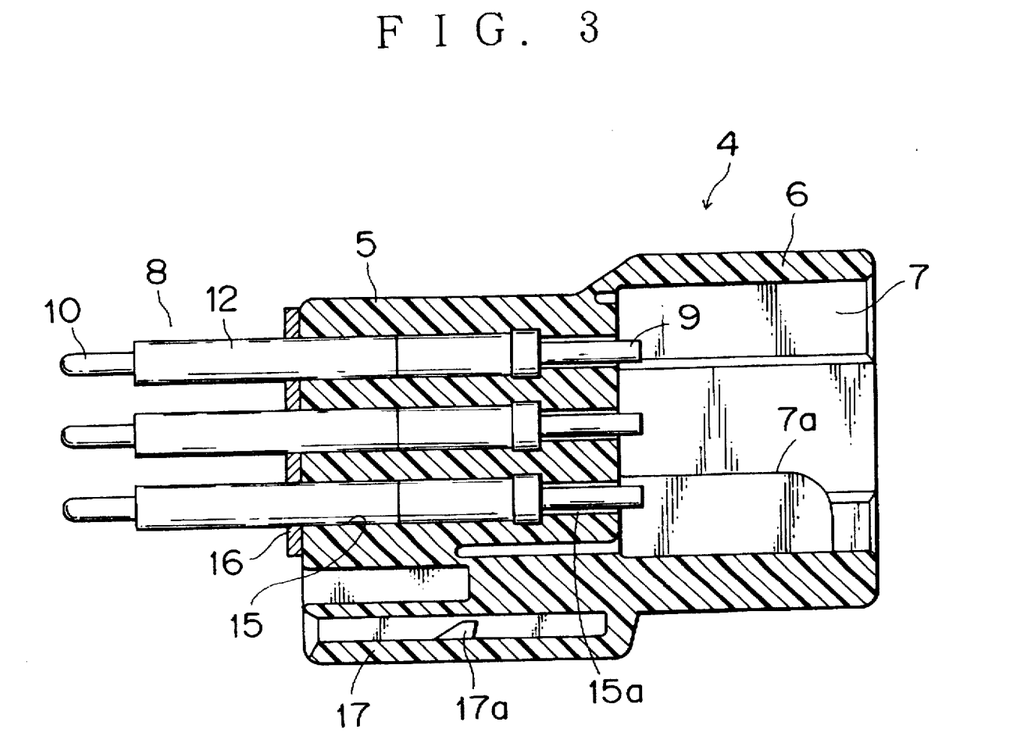
FIG. 3 is a longitudinal sectional view of FIG. 2.
Figure 10:
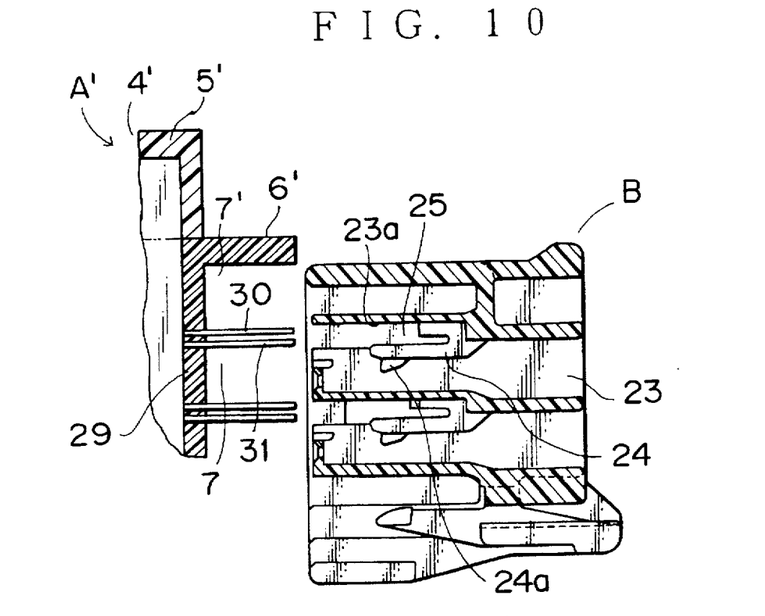
FIG. 10 is a sectional view of essential portions of a connector inspection device according to another embodiment of this invention and a connector to be inspected.

In connector inspection device A' in FIG. 10, an inspection main body 4' is removably mounted in the mounting opening 3 provided in the base mount 1 as in the embodiment shown in FIG. 1. An insulating housing 5' of inspection main body 4' is extended forwardly by a hood 6' which constitutes an inspection chamber 7' and which has pairs of spring switches 30, 31 provided therein in correspondence to respective terminal-accommodating chambers 23 of connector B, the spring switches being at their base portion insulatingly fixed on an inner partition wall 29. Each pair of spring switches 30, 31 is positioned to face the relevant resilient-displacement allowing space 25 between an inner wall 23a and resilient locking piece 24 in terminal-accommodating chamber 23 and is of such size as to advance into the space 25.

Each spring switch 30, 31 and check lamp 19 are connected in series with a lead wire 21' to battery 20 to constitute an electric circuit 18' for inspection. In other words, the plus (+) side of battery 20 is connected to one end of check lamp 19, whose other end is connected in parallel to each spring switch 30 at its base, and the minus (−) side of battery 20 is connected in parallel to each spring switch 31 at its base.

The inspection of a connector with inspection device A' will now be described with reference to FIGS. 11 to 13.

Figure 11:
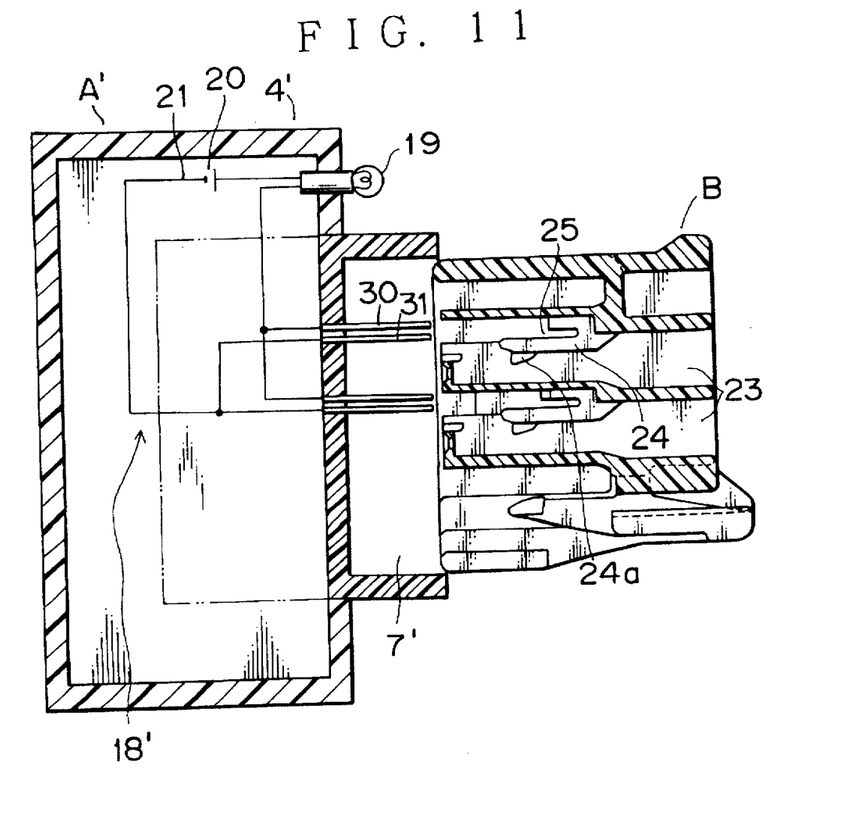
FIGS. 11, 12 and 13 are explanatory views of sequential inspection steps of a connector with the connector inspection device of FIG. 10.
Figure 12:
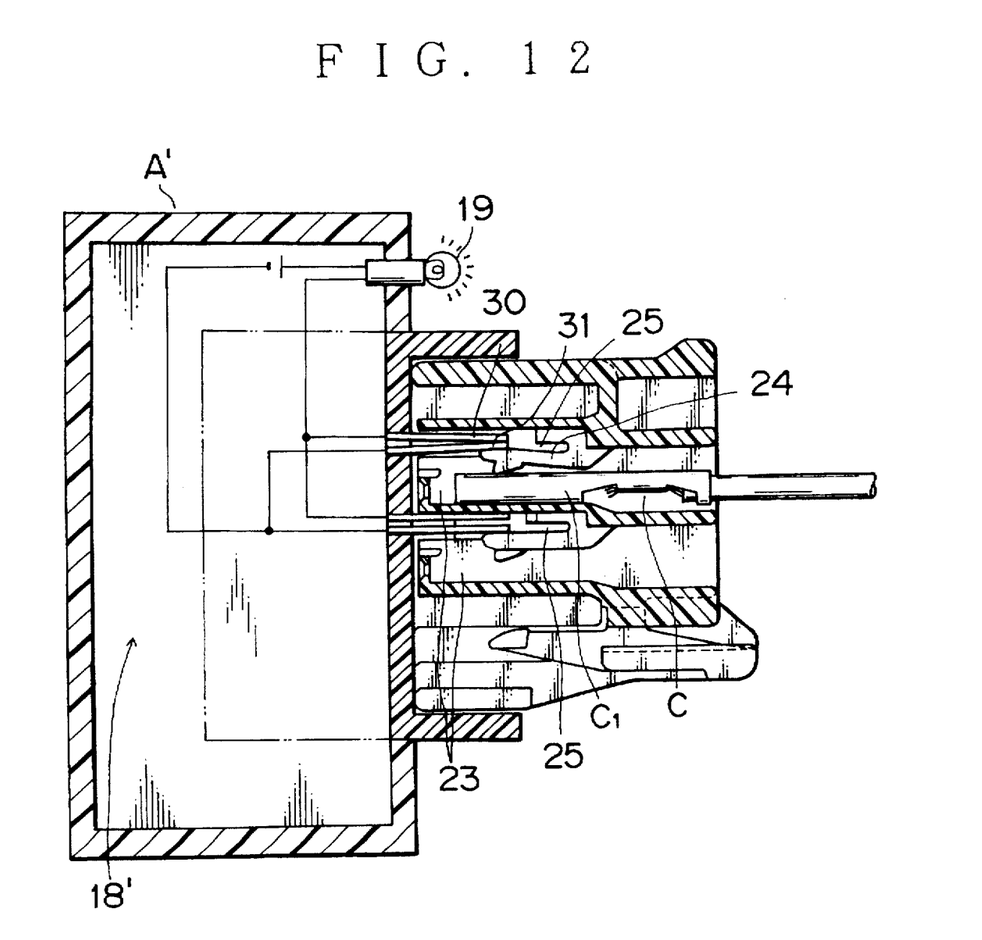

First, as shown in FIG. 11, a connector B with terminal lugs not yet inserted thereinto is set in inspection chamber 7' on inspection main body 4', so that each pair of spring switches 30, 31 advance into respective resilient-displacement allowing spaces 25 inside terminal-accommodating chambers 23 as is illustrated in terminal-accommodating chamber 23 on the lower side in FIG. 12.

Terminal lug C is halfway inserted in the terminal-accommodating chamber 23 on the upper side in FIG. 12, with its electric contact portion C1 bending resilient locking piece 24 into resilient-displacement allowing space 25, so that spring switches 30, 31 are closed. Consequently, the electric circuit 18' is energized to light check lamp 19, which is continued until just before the terminal lug C is put into fully-inserted position.

Figure 13:
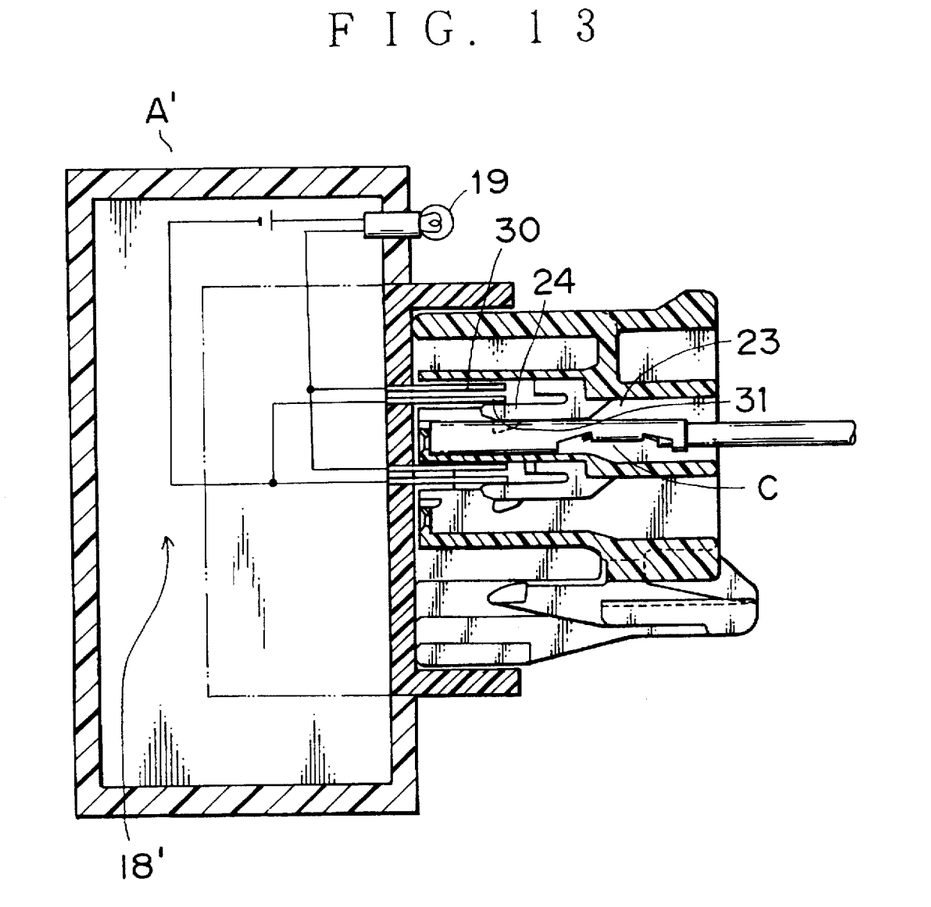

The terminal lug C in the upper terminal-accommodating chamber 23 in FIG. 12 has advanced into fully-inserted position in FIG. 13, with check lamp 19 now put out. In this state, locking piece 24 has resiliently returned to its original position so as to engage with the terminal lug C and lock same in place, and to release the spring switches 30, 31 from the pressure thereon by locking piece 24. Consequently, the spring switches 30, 31 are opened to shut off the electric circuit 18' and put out check lamp 19. If terminal lug C is stopped on the way to its fully-inserted position, check lamp 19 is not put out, thereby letting it be known that the terminal lug C is still to be further inserted.

With the construction as described above, the inserting operation of terminal lug C into housing 22 can be checked through the lighting of check lamp 19, and its full insertion and locking through the putting out of the check lamp, thereby enabling both assembly and inspection of a connector to be performed at one time as is the case with inspection device A.

Having now fully described the invention, it will be apparent to one of ordinary skill in the art that many changes and modifications can be made thereto without departing from the spirit and scope of the invention as set forth herein.

What is claimed is:

1. In a method of inspecting a connector by an inspection device, said connector including a connector housing, a terminal-accommodating chamber in said connector housing, and a resilient locking piece with a locking projection provided in said terminal-accommodating chamber with a resilient-displacement allowing space adjacent thereto, said inspection device including an inspection chamber, an inspection pin provided in said inspection chamber and comprising a stationary pin and a movable pin normally urged apart from said stationary pin by means of a spring, and an inspection electric circuit which is energized when said stationary and movable pins are brought into contact with each other, the steps of:

setting said connector housing in said inspection chamber so that said movable pin is located inside a front end portion of said terminal-accommodating chamber;

inserting a terminal lug into said terminal-accommodating chamber from a side remote from said inspection pin, said terminal lug including a locking portion and being attached to an end of an electric wire;

advancing said terminal lug while through contact therewith displacing said resilient locking piece into said resilient-displacement allowing space so that said resilient locking piece, when in alignment with said locking portion of the terminal lug, restores its original position to have said locking projection engaged in said locking portion to lock said terminal lug in said terminal-accommodating chamber, and through contact therewith moving said movable pin rearwardly against said spring towards said stationary pin so that in fully-inserted position said movable pin comes into contact with said stationary pin to energize said inspection electric circuit and thereby to let it be known that said terminal lug has been fully inserted; and releasing hold from said terminal lug so that said movable pin is moved by said spring towards said terminal lug by a distance corresponding to a clearance present between an edge of said locking portion of the terminal lug and said locking projection, thereby to separate said movable pin from said stationary pin and cut off said inspection electric circuit.

2. In a method of inspecting a connector by an inspection device, said connector including a connector housing, a terminal-accommodating chamber in said connector housing, and a resilient locking piece with a locking projection provided in said terminal-accommodating chamber with a resilient-displacement allowing space adjacent thereto, said inspection device including an inspection chamber, a pair of spring switches provided in said inspection chamber, and an inspection electric circuit which is energized when said spring switches are closed, the steps of:

setting said connector housing in said inspection chamber so that said pair of spring switches is located inside said resilient-displacement allowing space in said terminal-accommodating chamber;

inserting a terminal lug into said terminal-accommodating chamber from a side remote from said pair of spring switches, said terminal lug including a locking portion and being attached to an end of an electric wire;

advancing said terminal lug while through contact therewith displacing said resilient locking piece into said resilient-displacement allowing space so that said spring switches are brought into contact with each other to energize said inspection electric circuit and thereby to let it be known that said terminal lug is on its way to be fully inserted; and further advancing said terminal lug so that said resilient locking piece, when in alignment with said locking portion of the terminal lug, restores its original position to have said locking projection engaged in said locking portion to lock said terminal lug in said terminal-accommodating chamber, and at the same time to open said spring switches to cut off said inspection electric circuit in fully-inserted position.

3. A device for inspecting a connector including a connector housing, a plurality of terminal-accommodating chambers formed in said connector housing, and a resilient locking piece provided in each of said terminal-accommodating chambers and including a locking projection engageable with a terminal lug for locking said terminal lug in the terminal-accommodating chamber, comprising:

an inspection chamber for setting therein said connector; and a plurality of inspection pins provided in said inspection chamber, each of said inspection pins comprising a stationary pin and a movable pin normally urged apart from said stationary pin to project forwardly into a related one of said terminal-accommodating chambers when said connector housing is set in said inspection chamber, said stationary pin being connected to one end of an inspection electric circuit and said movable pin to the other end of said electric circuit, wherein when, after said connector housing has been set in said inspection chamber, a terminal lug, which is attached to an end of an electric wire, is fully inserted into one of said terminal-accommodating chambers, said terminal lug abuts against said movable pin to move same rearwardly against said spring into contact with said stationary pin to energize said inspection electric circuit, and wherein, after said electric circuit has been energized, hold is released from said terminal lug so that said movable pin is separated by said spring from said stationary pin to retract said terminal lug until it abuts against said locking projection and to shut off said inspection electric circuit.

4. A device for inspecting a connector including a connector housing, a plurality of terminal-accommodating chambers formed in said connector housing, and a resilient locking piece provided in each of said terminal-accommodating chambers with a resilient-displacement allowing space adjacent thereto and including a locking projection engageable with a terminal lug for locking said terminal lug in the terminal-accommodating chamber, comprising:

an inspection chamber for setting therein said connector; and a plurality of pairs of spring switches provided in said inspection chamber, each of said pairs of spring switches being connected to an inspection electric circuit and being of such size as to advance into a related one of said resilient-displacement allowing spaces in said terminal-accommodating chambers when said connector housing is set in said inspection chamber, wherein when, after said connector housing has been set in said inspection chamber, a terminal lug, which is attached to an end of an electric wire, is inserted into one of said terminal-accommodating chambers and on its way to be fully inserted, said terminal lug contacts said resilient locking piece to displace same into said resilient-displacement allowing space, thereby to close the related one of said pairs of spring switches to energize said inspection electric circuit, and wherein when said terminal lug has advanced into fully-inserted position, said resilient locking piece restores its original position to allow said pair of spring switches to open and shut off said electric circuit.

* * * * *